(12) United States Patent
Jiang et al.

(10) Patent No.: US 10,866,518 B2
(45) Date of Patent: Dec. 15, 2020

(54) SOLVENTS FOR USE IN THE ELECTRONICS INDUSTRY

(71) Applicant: Dow Global Technologies LLC, Midland, MI (US)

(72) Inventors: Qi Jiang, Shanghai (CN); Hua Ren, Shanghai (CN); Xin Jiang, Shanghai (CN); Eungkyu Kim, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 76 days.

(21) Appl. No.: 16/336,307

(22) PCT Filed: Sep. 28, 2016

(86) PCT No.: PCT/CN2016/100458
§ 371 (c)(1),
(2) Date: Mar. 25, 2019

(87) PCT Pub. No.: WO2018/058339
PCT Pub. Date: Apr. 5, 2018

(65) Prior Publication Data
US 2019/0219925 A1   Jul. 18, 2019

(51) Int. Cl.
| | | |
|---|---|---|
| *C11D 3/26* | (2006.01) | |
| *C11D 3/28* | (2006.01) | |
| *C11D 3/32* | (2006.01) | |
| *G03F 7/42* | (2006.01) | |
| *C11D 7/50* | (2006.01) | |
| *C11D 11/00* | (2006.01) | |

(52) U.S. Cl.
CPC .............. *G03F 7/425* (2013.01); *G03F 7/426* (2013.01); *C11D 7/5009* (2013.01); *C11D 7/5013* (2013.01); *C11D 11/0047* (2013.01)

(58) Field of Classification Search
CPC .... C11D 3/26; C11D 3/28; C11D 3/32; C11D 3/3445; C11D 7/5009; C11D 7/5013; C11D 11/0047; G03F 7/426
See application file for complete search history.

(56) References Cited

U.S. PATENT DOCUMENTS

| | | | |
|---|---|---|---|
| 5,496,491 A | 3/1996 | Ward et al. | |
| 5,556,482 A | 9/1996 | Ward et al. | |
| 6,773,873 B2 | 8/2004 | Seijo et al. | |
| 8,324,143 B2 | 12/2012 | Suzuki et al. | |
| 10,487,178 B2 * | 11/2019 | Kim | ........................ C08G 73/10 |
| 2019/0211286 A1 * | 7/2019 | Jiang | ................... C11D 11/0047 |

FOREIGN PATENT DOCUMENTS

| | | | | |
|---|---|---|---|---|
| CN | 101866118 A | | 10/2010 | |
| CN | 104597728 A | | 5/2015 | |
| CN | 104781732 | * | 7/2015 | ............. G03F 7/425 |
| JP | H08-198834 A | | 8/1996 | |
| JP | 2003-183390 A | | 7/2003 | |
| KR | 20140087758 A | | 7/2014 | |
| TW | 201413402 A | | 4/2014 | |
| WO | 2010/118916 A1 | | 10/2010 | |
| WO | 2011/059280 A2 | | 5/2011 | |
| WO | 2014/081127 A1 | | 5/2014 | |

OTHER PUBLICATIONS

Translation of KR20140087758A.

* cited by examiner

*Primary Examiner* — Brian P Mruk
(74) *Attorney, Agent, or Firm* — Quarles & Brady LLP

(57) ABSTRACT

Solvents useful for removing, among other things, photoresists and poly(amic acid)/polyimide from display/semiconductor substrates or electronic processing equipment, consist essentially of: (A) a first component consisting of at least one of dimethyl sulfoxide (DMSO) and N-formyl morpholine, and (B) a second component consisting of at least one of N,N-dimethyl propionamide, 3-methoxy-N,N-dimethyl propanamide, N,N-dimethyl acetoacetamide and N-methyl-ε-caprolactam.

19 Claims, No Drawings

SOLVENTS FOR USE IN THE ELECTRONICS INDUSTRY

FIELD

This invention relates to ecology-friendly solvents ("eco-solvents") useful in the manufacture of various electronic components, e.g., display units and semiconductors.

BACKGROUND

Some polar solvents, e.g., N-methyl-2-pyrrolidone (NMP), dimethyl acetamide (DMAc), dimethyl formamide (DMF), etc., have reproductive toxicity, which drive the ever increasing global safety and regulatory concerns related to these materials. For example, NMP is listed in the Substance of Very High Concerns (SVHC) registry of the European Globally Harmonized System of Classification and Labeling of Chemicals (GHS), and in REACH Annex XVII which lists the restrictions on the manufacture, placing on the market and use of certain dangerous substances, mixtures and articles.

NMP is used in the electronics industry for cleaning and stripping of various parts (e.g., components for display units, semiconductor substrates, etc.) and equipment, and considerable amounts of it are consumed annually. Developing an eco-solvent to achieve similar performance with a better environmental profile than NMP is an urgent request from electronic processing customers. This invention details solvent combinations that, in some embodiments, provide the same or better cleaning ability, and stripping ability for photoresist removal, than NMP.

SUMMARY

In one embodiment the invention is a solvent consisting essentially of:
  (A) a first component consisting of at least one of dimethyl sulfoxide (DMSO) and N-formyl morpholine, and
  (B) a second component consisting of at least one of N,N-dimethyl propionamide, 3-methoxy-N,N-dimethyl propanamide, N,N-dimethyl acetoacetamide and N-methyl-ε-caprolactam.

In one embodiment the invention is a process of cleaning or stripping a surface of a substrate, the process comprising the step of contacting the substrate with a solvent consisting essentially of:
  (A) a first component consisting of at least one of dimethyl sulfoxide (DMSO) and N-formyl morpholine, and
  (B) a second component consisting of at least one of N,N-dimethyl propionamide, 3-methoxy-N,N-dimethyl propanamide, N,N-dimethyl acetoacetamide and N-methyl-ε-caprolactam.

DETAILED DESCRIPTION

Definitions

For purposes of United States patent practice, the contents of any referenced patent, patent application or publication are incorporated by reference in their entirety (or its equivalent U.S. version is so incorporated by reference) especially with respect to the disclosure of definitions (to the extent not inconsistent with any definitions specifically provided in this disclosure) and general knowledge in the art.

The numerical ranges disclosed herein include all values from, and including, the lower and upper value. For ranges containing explicit values (e.g., 1 to 7), any subrange between any two explicit values is included (e.g., 1 to 2; 2 to 6; 5 to 7; 3 to 7; 5 to 6; etc.).

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step, or procedure, excepting those that are not essential to operability. The term "consisting of" excludes any component, step, or procedure not specifically delineated or listed. The term "or," unless stated otherwise, refers to the listed members individually as well as in any combination. Use of the singular includes use of the plural and vice versa.

Unless stated to the contrary, implicit from the context, or customary in the art, all parts and percents are based on weight and all test methods are current as of the filing date of this disclosure.

"Solvent" and like terms mean a substance that is capable of dissolving another substance (i.e., a solute) to form an essentially uniformly dispersed mixture (i.e., solution) at the molecular or ionic size level.

"Electronic part" and like terms mean an in-process or finished product, or component of a product, of a manufacturing process for electronic goods, such as a semiconductor or display unit. Electronic part, as used in the context of this invention, includes the equipment used to manufacture the product.

"In-process product" and like terms mean an unfinished or intermediate product. In-process products include starting materials, e.g., materials as received from vendors, or materials before subjected to the start of the manufacturing process.

"Photoresist" and like terms mean a photosensitive resin that loses its resistance to chemical etching when exposed to radiation and is used especially in the transference of a circuit pattern to a semiconductor chip during the production of an integrated circuit.

"Cleaning" and like terms mean, in the context of this invention, the removal of particulate contamination and metal ions from the surface of a substrate, usually from the surface of an in-process electronic part to ready the part for subsequent processing.

"Stripping" and like terms mean, in the context of this invention, the removal of a layer, e.g., coating or film, from the surface of a substrate, such as the removal of a photoresist from the surface of a semiconductor substrate.

Poly(amic acid) is an intermediate polymer in the synthesis of polyimide. It is soluble in polar solvents due to strong hydrogen bonding.

Polyimide (PI) is a polymer of imide monomers. It is normally produced by the reaction of a dianhydride and a diamine. One common PI used in the electronics industry is KAPTON™ It is produced from the condensation of pyromellitic dianhydride and 4,4'-oxydiphenylamine.

Solvents

The solvents of this invention consist essentially of a first component and a second component. The first component consists of, or consists essentially of, at least one of dimethyl sulfoxide (DMSO) (CAS Number 67-68-5) and N-formyl morpholine (CAS Number 4394-85-8). The second component consists of, or consists essentially of, at least one of N,N-dimethyl propionamide (CAS Number 758-96-3), 3-methoxy-N,N-dimethyl propanamide (CAS Number 53185-52-7), N,N-dimethyl acetoacetamide (CAS Number 2044-64-6) and N-methyl-ε-caprolactam (CAS Number 2556-73-2). The first and second components form a blend, and the blend may or may not be miscible.

In one embodiment the solvent is a binary solvent consisting essentially of DMSO and N,N-dimethyl propionamide.

In one embodiment the solvent is a binary solvent consisting essentially of DMSO and 3-methoxy-N,N-dimethyl propanamide.

In one embodiment the solvent is a binary solvent consisting essentially of DMSO and N-methyl-ε-caprolactam.

In one embodiment the solvent is a binary solvent consisting essentially of DMSO and N,N-dimethyl acetoacetamide.

In one embodiment the solvent is a binary solvent consisting essentially of N-formyl morpholine and N,N-dimethyl propionamide.

In one embodiment the solvent is a binary solvent consisting essentially of N-formyl morpholine and 3-methoxy-N,N-dimethyl propanamide.

In one embodiment the solvent is a binary solvent consisting essentially of N-formyl morpholine and N-methyl-ε-caprolactam.

In one embodiment the solvent is a binary solvent consisting essentially of N-formyl morpholine and N,N-dimethyl acetoacetamide.

In one embodiment the solvent is a ternary solvent consisting essentially of DMSO, N,N-dimethyl propionamide and 3-methoxy-N,N-dimethyl propanamide.

In one embodiment the solvent is a ternary solvent consisting essentially of DMSO, N,N-dimethyl propionamide and N,N-dimethyl acetoacetamide.

In one embodiment the solvent is a ternary solvent consisting essentially of DMSO, N,N-dimethyl propionamide and N-methyl-ε-caprolactam.

In one embodiment the solvent is a ternary solvent consisting essentially of DMSO, 3-methoxy-N,N-dimethyl propanamide and N,N-dimethyl acetoacetamide.

In one embodiment the solvent is a ternary solvent consisting essentially of DMSO, 3-methoxy-N,N-dimethyl propanamide and N-methyl-ε-caprolactam.

In one embodiment the solvent is a ternary solvent consisting essentially of DMSO, N,N-dimethyl acetoacetamide and N-methyl-ε-caprolactam.

In one embodiment the solvent is a ternary solvent consisting essentially of N-formyl morpholine, N,N-dimethyl propionamide and 3-methoxy-N,N-dimethyl propanamide.

In one embodiment the solvent is a ternary solvent consisting essentially of N-formyl morpholine, N,N-dimethyl propionamide and N,N-dimethyl acetoacetamide.

In one embodiment the solvent is a ternary solvent consisting essentially of N-formyl morpholine, N,N-dimethyl propionamide and N-methyl-ε-caprolactam.

In one embodiment the solvent is a ternary solvent consisting essentially of N-formyl morpholine, 3-methoxy-N,N-dimethyl propanamide and N,N-dimethyl acetoacetamide.

In one embodiment the solvent is a ternary solvent consisting essentially of N-formyl morpholine, 3-methoxy-N,N-dimethyl propanamide and N-methyl-ε-caprolactam.

In one embodiment the solvent is a ternary solvent consisting essentially of N-formyl morpholine, N,N-dimethyl acetoacetamide and N-methyl-ε-caprolactam.

In one embodiment the solvent is a ternary solvent consisting essentially of DMSO, N-formyl morpholine and N,N-dimethyl propionamide.

In one embodiment the solvent is a ternary solvent consisting essentially of DMSO, N-formyl morpholine and 3-methoxy-N,N-dimethyl propanamide.

In one embodiment the solvent is a ternary solvent consisting essentially of DMSO, N-formyl morpholine and N,N-dimethyl acetoacetamide.

In one embodiment the solvent is a ternary solvent consisting essentially of DMSO, N-formyl morpholine and N-methyl-ε-caprolactam.

In one embodiment the solvent is a quaternary solvent consisting essentially of DMSO, N,N-dimethyl propionamide, 3-methoxy-N,N-dimethyl propanamide and N,N-dimethyl acetoacetamide.

In one embodiment the solvent is a quaternary solvent consisting essentially of DMSO, N,N-dimethyl propionamide, 3-methoxy-N,N-dimethyl propanamide and N-methyl-ε-caprolactam.

In one embodiment the solvent is a quaternary solvent consisting essentially of DMSO, 3-methoxy-N,N-dimethyl propanamide, N,N-dimethyl acetoacetamide and N-methyl-ε-caprolactam.

In one embodiment the solvent is a quaternary solvent consisting essentially of N-formyl morpholine, N,N-dimethyl propionamide, 3-methoxy-N,N-dimethyl propanamide and N,N-dimethyl acetoacetamide.

In one embodiment the solvent is a quaternary solvent consisting essentially of N-formyl morpholine, N,N-dimethyl propionamide, 3-methoxy-N,N-dimethyl propanamide and N-methyl-ε-caprolactam.

In one embodiment the solvent is a quaternary solvent consisting essentially of N-formyl morpholine, 3-methoxy-N,N-dimethyl propanamide, N,N-dimethyl acetoacetamide and N-methyl-ε-caprolactam.

In one embodiment the solvent is a quaternary solvent consisting essentially of DMSO, N-formyl morpholine, N,N-dimethyl propionamide, and 3-methoxy-N,N-dimethyl propanamide.

In one embodiment the solvent is a quaternary solvent consisting essentially of DMSO, N-formyl morpholine, N,N-dimethyl propionamide, and N,N-dimethyl acetoacetamide.

In one embodiment the solvent is a quaternary solvent consisting essentially of DMSO, N-formyl morpholine, N,N-dimethyl propionamide, and N-methyl-ε-caprolactam.

In one embodiment the solvent is a quaternary solvent consisting essentially of DMSO, N-formyl morpholine, 3-methoxy-N,N-dimethyl propanamide and N,N-dimethyl acetoacetamide.

In one embodiment the solvent is a quaternary solvent consisting essentially of DMSO, N-formyl morpholine, 3-methoxy-N,N-dimethyl propanamide and N-methyl-ε-caprolactam.

In one embodiment the solvent is a quaternary solvent consisting essentially of DMSO, N-formyl morpholine, N,N-dimethyl acetoacetamide and N-methyl-ε-caprolactam.

In one embodiment the solvent is a quinary solvent consisting essentially of DMSO, N,N-dimethyl propionamide, 3-methoxy-N,N-dimethyl propanamide, N,N-dimethyl acetoacetamide and N-methyl-ε-caprolactam.

In one embodiment the solvent is a quinary solvent consisting essentially of N-formyl morpholine, N,N-dimethyl propionamide, 3-methoxy-N,N-dimethyl propanamide, N,N-dimethyl acetoacetamide and N-methyl-ε-caprolactam.

In one embodiment the solvent is a quinary solvent consisting essentially of DMSO, N-formyl morpholine, N,N-dimethyl propionamide, 3-methoxy-N,N-dimethyl propanamide, and N,N-dimethyl acetoacetamide.

In one embodiment the solvent is a quinary solvent consisting essentially of DMSO, N-formyl morpholine, 3-methoxy-N,N-dimethyl propanamide, N,N-dimethyl acetoacetamide and N-methyl-ε-caprolactam.

In one embodiment the solvent is a quinary solvent consisting essentially of DMSO, N-formyl morpholine, 3-methoxy-N,N-dimethyl propanamide, N,N-dimethyl acetoacetamide and N-methyl-ε-caprolactam.

In one embodiment the solvent is a senary solvent consisting essentially of DMSO, N-formyl morpholine, N,N-dimethyl propionamide, 3-methoxy-N,N-dimethyl propanamide, N,N-dimethyl acetoacetamide and N-methyl-ε-caprolactam.

In one embodiment the solvent consists of, or consists essentially of, in weight percent (wt %) based on the weight of the solvent, from 1 to 70 wt %, or from 50 to 60 wt %, of the first component and from 30 to 99 wt %, or from 40 to 50 wt %, of the second component.

In one embodiment the solvent consists of, or consists essentially of, in weight percent (wt %) based on the weight of the solvent, from 1 to 70 wt %, or from 50 to 60 wt %, of N-formyl morpholine and from 30 to 99 wt %, or from 40 to 50 wt %, of at least one of N,N-dimethyl propionamide or 3-methoxy-N,N-propanamide.

In one embodiment the solvent consists of, or consists essentially of, in weight percent (wt %) based on the weight of the solvent, from 1 to 60 wt %, or from 30 to 40 wt %, of the first component and from 40 to 99 wt %, or from 60 to 70 wt %, of the second component.

In one embodiment the solvent consists of, or consists essentially of, in weight percent (wt %) based on the weight of the solvent, from 1 to 60 wt %, or from 30 to 40 wt %, of DMSO and from 40 to 99 wt %, or from 60 to 70 wt %, of at least one of N,N-dimethyl propionamide or 3-methoxy-N,N-propanamide.

In one embodiment the solvent consists of, or consists essentially of, in weight percent (wt %) based on the weight of the solvent, from 40 to 70 wt %, or from 45 to 65 wt %, of the first component and from 30 to 60 wt %, or from 40 to 55 wt %, of the second component.

In one embodiment the solvent consists of, or consists essentially of, in weight percent (wt %) based on the weight of the solvent, from 40 to 70 wt %, or from 45 to 65 wt %, of at least one of DMSO and N-formyl morpholine, and from 30 to 60 wt %, or from 40 to 55 wt %, of at least one of N,N-dimethyl acetoacetamide and N-methyl-ε-caprolactam.

In one embodiment the solvent consists of, or consists essentially of, in weight percent (wt %) based on the weight of the solvent, from 40 to 70 wt %, or from 45 to 65 wt %, of N-formyl morpholine, and from 30 to 60 wt %, or from 40 to 55 wt %, of N,N-dimethyl acetoacetamide.

In one embodiment the solvent consists of, or consists essentially of, in weight percent (wt %) based on the weight of the solvent, from 40 to 70 wt %, or from 45 to 65 wt %, of DMSO, and from 30 to 60 wt %, or from 40 to 55 wt %, of N-methyl-ε-caprolactam.

In those embodiments in which the first and/or second component consists of more than one substance, e.g., the first component consists essentially of DMSO and N-formyl morpholine, or the second component consists essentially of N,N-dimethyl propionamide and 3-methoxy-N,N-dimethyl propanamide, and/or N,N-dimethyl acetoacetamide, and/or N-methyl-ε-caprolactam, the amount of each substance in a particular component can vary widely and to convenience. The amount of each individual substance in the component can vary from 0 to 100 wt %, or from 1 to 99 wt %, or from 10 to 90 wt %, or from 20 to 80 wt % or from 30 to 70 wt %, or from 40 to 60 wt %, or 50 wt %, based on the weight of the component.

Optional materials that are not essential to the operability of, but can be included in, the solvents of this invention include, but are not limited to, antioxidants, colorants, water scavengers, stabilizers, and the like. These materials do not have any material impact on the efficacy of the solvent for cleaning or stripping electronic parts. These optional materials are used in known amounts, e.g., 0.10 to 5, or 4, or 3, or 2, or 1, weight percent based on the weight of the solvent, and they are used in known ways.

Preparation of the Solvent

The solvents of this invention are made using known equipment and known techniques. The individual components of the solvent are commercially available, liquid at ambient conditions (23° C. and atmospheric pressure), and can simply be mixed with one another using conventional mixing equipment and standard blending protocols. The components can be added to one another in any order including simultaneously.

Use of the Solvents

The solvents of this invention are eco-solvents, i.e., they do not have, or have at a reduced level, the toxicology issues associated with NMP. These solvents are useful for removing contaminants for cleaning and/or stripping the surfaces of substrates of contaminants and other unwanted substances, particularly polar contaminants and polar unwanted substances.

In one embodiment the solvents of this invention are intended as a replacement for NMP and other polar solvents used in the electronics industry. As such, they are used in the same manner as NMP and the other polar solvents in such operations as cleaning and stripping of electronic parts and equipment, and the removal of photoresists from various substrates, e.g., semiconductor substrates, and the removal of poly(amic acid) polymer residue from polyimide coating equipment, e.g., alignment layer and flexible display substrate coating machine. Typically, these methods or processes include the step of contacting the object or substrate to be cleaned or stripped, or from which a photoresist or a poly(amic acid)/polyimide is to be removed, with the solvent under any of various conditions, e.g., ambient conditions, or at an elevated temperature, with or without flow or agitation, e.g., printing, spinning, immersing, flushing, vibrating, showering, for a sufficient period of time to dissolve whatever material, e.g., a contaminant such as poly(amic acid)/polyimide residue, dianhydride, diamine, etc.; a photoresist, and the like, that is to be removed. This contacting step is then typically followed by rinse (one or more) and drying steps.

The following examples are nonlimiting illustrations of the invention.

Examples

Materials

Poly(amic acid), precursor of polyimide: poly (pyromellitic dianhydride-co-4,4'-oxydianiline), amic acid (from Sigma-Aldrich, 15~16 wt % dissolved in NMP).

Photoresist: SFP-1400 (from Merck).

Solvents: N-formyl morpholine (from Accela ChemBio, 98%); dimethyl sulfoxide (DMSO) (from Sinopharm, 99%), 3-methoxy-N,N-dimethyl propanamide (from BOC Science, 98%), N,N-dimethyl propionamide, N,N-dimethyl acetoacetamide, and N-methyl-ε-caprolactam (from Energy Chemical, 98% for all).

Solvents

The solvents are designed according to Hansen Solubility Parameter of NMP, DMF, 3-methoxy-N,N-dimethyl propanamide, etc. These commercialized solvents have strong dissolution ability for most electronic materials. The solvents are described in Table 1.

The performance is judged through the fluidity of the solution. The two examples, N-formyl morpholine/N,N-dimethyl propionamide, and dimethyl sulfoxide/N,N-dimethyl propionamide exhibit good fluidity with low viscosity. N-formyl morpholine/3-methoxy-N,N-dimethyl propanamide shows a certain fluidity and suitable viscosity. However, in comparative samples, 3-methoxy-N,N-dimethyl propanamide, gels occur in the solutions, which represents the oversaturation of polymer. For N-methyl-2-pyrrolidone, although the sample is able to flow, its viscosity is com-

TABLE 1

Solvents

| Example | Component A | Weight % | Component B | Weight % |
|---|---|---|---|---|
| 1 | N-formyl morpholine | 60 | N,N-dimethyl propionamide | 40 |
| 2 | N-formyl morpholine | 60 | 3-methoxy-N,N-dimethyl propanamide | 40 |
| 3 | dimethyl sulfoxide | 40 | N,N-dimethyl propionamide | 60 |
| 4 | dimethyl sulfoxide | 33 | 3-methoxy-N,N-dimethyl propanamide | 67 |

| Comparative Example | Component A | Weight % | Component B | Weight % | Component C | Weight % |
|---|---|---|---|---|---|---|
| 1 | N-methyl-2-pyrrolidone | 100 | | | | |
| 2 | 3-methoxy-N,N-dimethyl propanamide | 100 | | | | |
| 3 | monoethanolamine | 15 | diethylene glycol butyl ether | 20 | DI water | 65 |
| 4 | monoethanolamine | 30 | diethylene glycol butyl ether | 70 | | |
| 5 | monoethanolamine | 10 | N-methyl-2-pyrrolidone | 70 | DI water | 20 |

Protocols

Poly(amic acid) dissolution: A solution of poly (pyromellitic dianhydride-co-4,4'-oxydianiline), amic acid precursor in NMP is contacted with deionized (DI) water or other NMP-insoluble liquid to extract the precursor from the NMP. The poly(amic acid) precursor is then baked at 54° C. for 4 hours to evaporate any residual solvent/liquid before it is dissolved by contact with the test solvent. Results are recorded after 12 hours at 54° C.

Photoresist stripping: Place 2 milliliters (ml) SFP-1400 photoresist solution onto the surface of glass substrate with a size of 100 millimeters (mm)×100 mm×1 mm. The substrate is spun with a rotation speed of 500 revolutions per minute (rpm) for 10 seconds (s) to spread out the photoresist solution. The rotation speed is then accelerated to 1000 rpm for 30 s to coat the photoresist homogenously and spin out redundant solvent. The coated substrate is heated to evaporate solvent at 130° C. for 10 minutes (min). The stripping step prepares 30 grams (g) example in the container. The baked substrate is placed into the container with shaking, and finally the time is measured for completely removing photoresist from the substrate.

Results

Poly(amic acid) dissolution: The poly (pyromellitic dianhydride-co-4,4'-oxydianiline), amic acid solubility results of each product are reported in Table 2. The content of polymer in each example and comparative sample is 20% by weight.

paratively high. In general, the solubility of poly (pyromellitic dianhydride-co-4,4'-oxydianiline), amic acid in N-methyl-2-pyrrolidone should be 15% by weight for commercial products. For 3-methoxy-N,N-dimethyl propanamide, the related solubility is comparatively lower. Therefore, the solvency for poly(amic acid) of examples is better than comparative samples.

TABLE 2

Poly(amic acid) (poly (pyromellitic dianhydride-co-4,4'-oxydianiline), amic acid) Solvency Performance of Solvents

| Example | | | | |
|---|---|---|---|---|
| Component A | Weight % | Component B | Weight % | Performance |
| dimethyl sulfoxide | 40 | N,N-dimethyl propionamide | 60 | ○ |
| dimethyl sulfoxide | 33 | 3-methoxy-N,N-dimethyl propanamide | 67 | ○ |
| N-formyl morpholine | 60 | N,N-dimethyl propionamide | 40 | ○ |
| N-formyl morpholine | 60 | 3-methoxy-N,N-dimethyl propanamide | 40 | ○ |

TABLE 2-continued

Poly(amic acid) (poly (pyromellitic dianhydride-co-4,4'-oxydianiline), amic acid) Solvency Performance of Solvents

| Comparative | | |
|---|---|---|
| Component | Wright % | Performance |
| N-methyl-2-pyrrolidone | 100 | ○ |
| 3-methoxy-N,N-dimethyl propanamide | 100 | X |

Circle = Fluidity;
X = Gel

Photoresist stripping: The photoresist stripping results of each combination are listed in Table 3. The performance is evaluated by stripping time. Dimethyl sulfoxide/N,N-dimethyl propionamide can completely strip the coated photoresist from the glass substrate within 30 seconds. The other three examples spend 30 to 45 seconds to strip the photoresist, which have a performance similar to the commercial comparative samples, water-based monoethanolamine/diethylene glycol butyl ether and monoethanolamine/N-methyl-2-pyrrolidone from Dongjin (see KR 1 403 516 B1). However the other commercial combination, monoethanolamine/diethylene glycol butyl ether without water content shows relatively slow stripping speed. The examples possess equivalent, even better stripping performance on SFP-1400 photoresist.

TABLE 3

Photoresist (SFP-1400) Stripping Performance of Solvents

| Example | | | | |
|---|---|---|---|---|
| Component A | Weight % | Component B | Weight % | Performance |
| dimethyl sulfoxide | 40 | N,N-dimethyl propanamide | 60 | ⊙ |
| dimethyl sulfoxide | 33 | 3-methoxy-N,N-dimethyl propanamide | 67 | ○ |
| N-formyl morpholine | 60 | N,N-dimethyl propanamide | 40 | ○ |
| N-formyl morpholine | 60 | 3-methoxy-N,N-dimethyl propanamide | 40 | ○ |

| Comparative | | | | | | |
|---|---|---|---|---|---|---|
| Component A | Wright % | Component B | Wright % | Component C | Wright % | Performance |
| monoethanolamine | 15 | diethylene glycol butyl ether | 20 | DI water | 65 | ○ |
| monoethanolamine | 30 | diethylene glycol butyl ether | 70 | | | X |
| monoethanolamine | 10 | N-methyl-2-pyrrolidone | 70 | DI Water | 20 | ○ |

Circle with dot = less than (<) 15 seconds;
Circle without dot = 15-30 seconds;
X = greater than (>) 30 seconds.

The invention claimed is:

1. A solvent consisting of:
   (A) a first component consisting of at least one of dimethyl sulfoxide (DMSO) and N-formyl morpholine, and
   (B) a second component consisting of at least one of N,N-dimethyl propionamide, 3-methoxy-N,N-dimethyl propanamide, N,N-dimethyl acetoacetamide and N-methyl-ε-caprolactam.

2. The solvent of claim 1 consisting of, based on the weight of the solvent, from 1 to 70 wt% of the first component and from 30 to 99 wt% of the second component.

3. The solvent of claim 2 in which the first component is N-formyl morpholine and the second component consists of at least one of N,N-dimethyl propionamide or 3-methoxy-N, N-propanamide.

4. The solvent of claim 3 in which the second component is N,N-dimethyl propionamide.

5. The solvent of claim 3 in which the second component is 3-methoxy-N,N-propanamide.

6. The solvent of claim 1 consisting of, based on the weight of the solvent, from 1 to 60 wt% of the first component and from 40 to 99 wt% of the second component.

7. The solvent of claim 6 in which the first component is DMSO and the second component consists of at least one of N,N-dimethyl propionamide or 3-methoxy-N,N-propanamide.

8. The solvent of claim 7 in which the second component is N,N-dimethyl propionamide.

9. The solvent of claim 7 in which the second component is 3-methoxy-N, N-propanamide.

10. The solvent of claim 1 consisting of, based on the weight of the solvent, from 40 to 70 wt% of the first component and from 30 to 60 wt% of the second component.

11. The solvent of claim 10 in which the first component consists of at least one of DMSO and N-formyl morpholine, and the second component consists of at least one of N,N-dimethyl acetoacetamide and N-methyl-ε-caprolactam.

12. The solvent of claim 11 in which the first component is N-formyl morpholine, and the second component is N,N-dimethyl acetoacetamide.

13. The solvent of claim 11 in which the first component is DMSO, and the second component is N-methyl-ε-caprolactam.

14. A process of cleaning or stripping a surface of a substrate, the process comprising the step of contacting the substrate with a solvent consisting of:
   (A) a first component consisting of at least one of dimethyl sulfoxide (DMSO) and N-formyl morpholine, and (B) a second component consisting of at least one of N,N-dimethyl propionamide, 3-methoxy-N,N-dimethyl propanamide, N,N-dimethyl acetoacetamide and N-methyl-ε-caprolactam.

15. The process of claim 14 in which the substrate is an electronic part and the surface contains a contaminant or metal ions.

16. The process of claim 15 in which the contaminant is a poly(amic acid) residue, or a polyimide residue.

17. The process of claim 14 in which the substrate is an electronic part and surface contains a photoresist.

18. The process of claim 14 in which the first component is DMSO.

19. The process of claim 14 in which the first component is N-formyl morpholine.

* * * * *